United States Patent
Jung (10) Patent No.: US 11,855,625 B2
(45) Date of Patent: Dec. 26, 2023

(54) SEMICONDUCTOR APPARATUS, SEMICONDUCTOR SYSTEM, AND OPERATING METHOD OF SEMICONDUCTOR APPARATUS

(71) Applicant: SK hynix Inc., Gyeonggi-do (KR)

(72) Inventor: Jae Hoon Jung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/744,835

(22) Filed: May 16, 2022

(65) Prior Publication Data

US 2023/0231556 A1 Jul. 20, 2023

(30) Foreign Application Priority Data

Jan. 20, 2022 (KR) .................. 10-2022-0008465

(51) Int. Cl.
*H03K 19/00* (2006.01)
*G11C 7/10* (2006.01)

(52) U.S. Cl.
CPC ....... *H03K 19/0005* (2013.01); *G11C 7/1048* (2013.01)

(58) Field of Classification Search
None
See application file for complete search history.

(56) References Cited

U.S. PATENT DOCUMENTS

| 2012/0056641 A1* | 3/2012 | Kuroki ............... H04L 25/0278 326/30 |
| 2013/0088258 A1* | 4/2013 | Yokou ............... G11C 11/4093 326/30 |
| 2018/0247690 A1* | 8/2018 | Lee .................... G11C 11/4087 |

FOREIGN PATENT DOCUMENTS

| KR | 10-0862316 B1 | 10/2008 |
| KR | 10-0974225 B1 | 8/2010 |
| KR | 10-2019-0000387 A | 1/2019 |

* cited by examiner

*Primary Examiner* — Anh Q Tran
(74) *Attorney, Agent, or Firm* — IP & T GROUP LLP (57) ABSTRACT

A semiconductor apparatus may include: a command generation circuit configured to generate a first internal command signal and a second internal command signal, which are sequentially activated on the basis of a data command signal for a data driving operation; an impedance setting circuit enabled on the basis of the first internal command signal, and configured to set impedance into which a reference resistance is reflected; and a data driving circuit enabled on the basis of the second internal command signal, and configured to perform the data driving operation on the basis of the set impedance.

29 Claims, 5 Drawing Sheets

SEMICONDUCTOR APPARATUS, SEMICONDUCTOR SYSTEM, AND OPERATING METHOD OF SEMICONDUCTOR APPARATUS

CROSS-REFERENCES TO RELATED APPLICATION

The present application claims priority under 35 U.S.C. § 119(a) to Korean patent application number 10-2022-0008465, filed on Jan. 20, 2022, which is incorporated herein by reference in its entirety.

BACKGROUND

1. Technical Field

Various embodiments of the present disclosure generally relate to a semiconductor apparatus, a semiconductor system, and an operating method of the semiconductor apparatus, and more particularly, to a semiconductor apparatus capable of setting impedance into which reference resistance is reflected for impedance matching, a semiconductor system, and an operating method of the semiconductor apparatus.

2. Related Art

In general, various types of semiconductor apparatuses each perform a preset operation according to a signal inputted thereto, and output a result value of the operation as a signal. The signal inputted to the semiconductor apparatus and the signal outputted from the semiconductor apparatus may be distorted by various factors.

One of the reasons that the signal inputted to the semiconductor apparatus and the signal outputted from the semiconductor apparatus are distorted is that the impedance of a transmitting side to transmit a signal is not matched with the impedance of a receiving side to receive a signal. Therefore, the semiconductor apparatus uses various methods to match the impedances of the transmitting side and the receiving side. Such various methods include a method for properly setting impedance by using a reference resistance. In general, the semiconductor apparatus has a reference resistance coupled thereto. The semiconductor apparatus implements impedance matching between the transmitting side and the receiving side by setting the impedance into which the reference resistance is reflected, in a setup operation time before a normal operation time.

Recently, however, with the increase in integration density of the semiconductor apparatus, a circuit operation of the semiconductor apparatus is affected even by a minimal environment change reflected into the semiconductor apparatus. Therefore, the impedance set in the setup operation time is different from impedance which needs to be actually reflected into the semiconductor apparatus, when the semiconductor apparatus receives a signal or outputs a signal in the normal operation time.

SUMMARY

In an embodiment of the present disclosure, a semiconductor apparatus may include: a command generation circuit configured to generate a first internal command signal and a second internal command signal, which are sequentially activated on the basis of a data command signal for a data driving operation; an impedance setting circuit enabled on the basis of the first internal command signal, and configured to set impedance into which a reference resistance is reflected; and a data driving circuit enabled on the basis of the second internal command signal, and configured to perform the data driving operation on the basis of the set impedance.

In an embodiment of the present disclosure, a semiconductor system may include: a control apparatus configured to provide a data command signal for a data driving operation, and provide data pattern information for a hidden calibration operation; and a semiconductor apparatus configured to sequentially perform the hidden calibration operation and the data driving operation on the basis of the data command signal and the data pattern information. The semiconductor apparatus may include: a command generation circuit configured to generate a first internal command signal and a second internal command signal, which are sequentially activated on the basis of the data command signal; an impedance setting circuit enabled on the basis of the first internal command signal, and configured to set impedance through the hidden calibration operation by applying, to a reference resistance, a voltage level corresponding to voltage drop information; an information mapping circuit configured to map the voltage drop information corresponding to a current consumed during the data driving operation according to the data pattern information to output the voltage drop information; and a data driving circuit enabled on the basis of the second internal command signal, and configured to perform the data driving operation on the basis of the set impedance.

In an embodiment of the present disclosure, an operation method of a semiconductor apparatus may include the operations of: generating a first internal command signal and a second internal command signal, which are sequentially activated on the basis of a data command signal for a data driving operation in a normal operation time after a setup operation time; setting impedance through a hidden calibration operation for a reference resistance, which is performed on the basis of the first internal command signal; and performing, according to the second internal command signal, a data driving operation on the basis of the set impedance.

In an embodiment of the present disclosure, an operating method of a semiconductor apparatus may include the operations of: setting, during a normal operation after a setup operation including a first calibration operation, impedance by performing a second calibration operation which reflects a reference resistance into the impedance; and performing a data driving operation based on the impedance set through the second calibration operation.

DETAILED DESCRIPTION

The present description of the present disclosure provides structural and functional details directed to various embodiments. The scope of the invention, however, is not limited to or by any of the disclosed embodiments nor to any particular detail provided herein. That is, those skilled in the art will understand in view of the present disclosure that any embodiment may be modified in various ways and may have various forms. Accordingly, the invention encompasses all such variations that fall within the scope of the claims including their equivalents. Furthermore, an embodiment does not necessarily include all stated objects or effects nor include only such objects and effects. Accordingly, the scope of the invention is not limited thereby.

Throughout the specification, reference to "an embodiment" or the like is not necessarily to only one embodiment, and different references to any such phrase are not necessarily to the same embodiment(s). The term "embodiments" when used herein does not necessarily refer to all embodiments.

Terms, such as "first" and "second", are used to distinguish one element from another element that otherwise have the same or similar names. A first element in one instance may be named a second element in another instance without indicating any substantive change in the element itself.

The singular is intended to include the plural, unless clearly expressed otherwise or it is clear from the context that only one is intended. Open-ended terms such as "include" or "have" should be understood as indicating the existence of stated characteristics, numbers, steps, operations, elements, parts, or combination thereof, but not excluding the possibility that one or more other characteristics, numbers, steps, operations, elements, parts, or combination thereof are present or may be added.

In each of the operations, symbols (e.g., a, b, and c) are used for convenience of a description, not necessarily to indicate any particular order of operations. Consistent with the teachings herein, operations may be performed in any suitable order, unless a specific order is clearly described or such order is indicated by the context. In some cases, two or more operations may be performed substantially at the same time.

All the terms used herein, including technological or scientific terms, have the same meanings as typically understood by those skilled in the art, unless otherwise defined. Terms defined in commonly used dictionaries should be construed in the context of the related technology and should not be construed as ideal or in an excessively formal way, unless clearly defined in the application.

Various embodiments are directed to a semiconductor apparatus capable of setting impedance into which a reference resistance is reflected for impedance matching, a semiconductor system, and an operating method of the semiconductor apparatus.

In accordance with the present embodiments, it is possible to optimize the impedance into which the reference resistance is reflected during the data driving operation, thereby minimizing the distortion of a signal inputted to the semiconductor apparatus and a signal outputted from the semiconductor apparatus.

Figure 1:
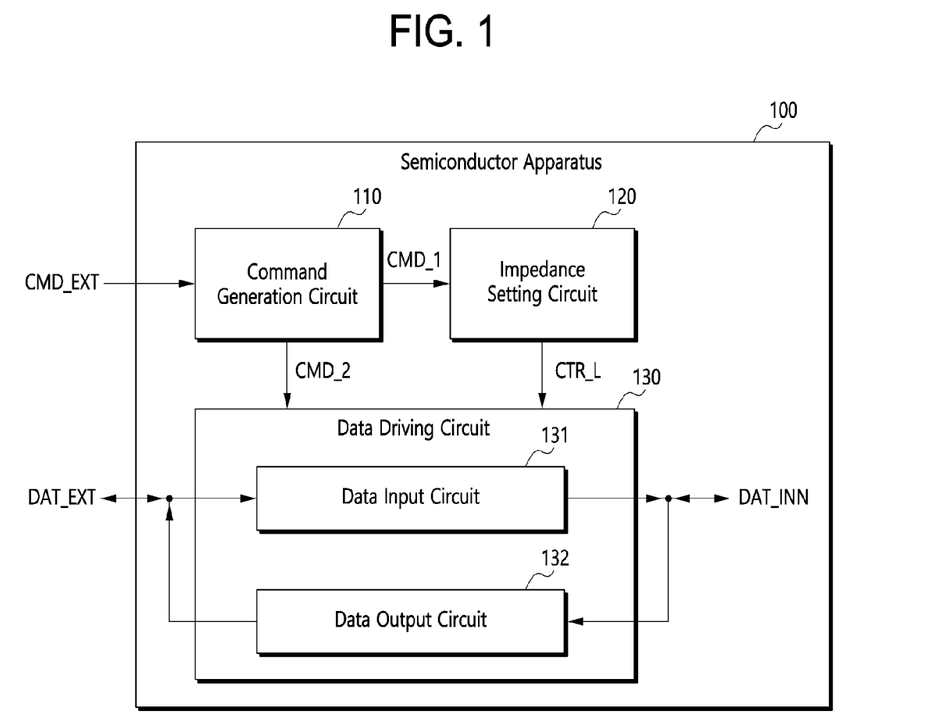
FIG. 1 is a block diagram illustrating the configuration of a semiconductor apparatus in accordance with an embodiment of the present disclosure.

FIG. 1 is a block diagram illustrating the configuration of a semiconductor apparatus 100 in accordance with an embodiment of the present disclosure.

Referring to FIG. 1, the semiconductor apparatus 100 may include a command generation circuit 110, an impedance setting circuit 120, and a data driving circuit 130.

The command generation circuit 110 may be configured to generate first and second internal command signals CMD_1 and CMD_2 on the basis of an external command signal CMD_EXT. The external command signal CMD_EXT may include command signals which are inputted at different time points as command signals for controlling various circuit operations on the semiconductor apparatus 100. Among the command signals, the external command signal CMD_EXT may include a 'data command signal' for a data driving operation. The data driving operation may include one or more operations of a data input operation in which the semiconductor apparatus 100 receives an external data signal DAT_EXT and a data output operation in which the semiconductor apparatus 100 outputs an internal data signal DAT_INN. Therefore, the command generation circuit 110 may receive a data command signal for the data driving operation through the external command signal CMD_EXT, and generate an internal command signal.

Then, the command generation circuit 110 may generate the first and second internal command signals CMD_1 and CMD_2 which are sequentially activated on the basis of the data command signal.

The first internal command signal CMD_1 may be an internal command signal for enabling the impedance setting circuit 120 which will be described below. The second internal command signal CMD_2 may be an internal command signal for enabling the data driving circuit 130. As described above, the command generation circuit 110 may sequentially activate the first internal command signal CMD_1 and the second internal command signal CMD_2. In other words, the second internal command signal CMD_2 may have a dependent relationship with the first internal command signal CMD_1. That is, the command generation circuit 110 may preferentially activate the first internal command signal CMD_1 for controlling the impedance setting circuit 120, before activating the second internal command signal CMD_2 for controlling the data driving circuit 130, on the basis of the data command signal for the data driving operation.

The impedance setting circuit 120 may be enabled on the basis of the first internal command signal CMD_1, and configured to set impedance into which a reference resistance (not illustrated) is reflected. Although not illustrated in the drawings, the reference resistance may be coupled to a signal line through which the external data signal DAT_EXT is transferred. The impedance setting circuit 120 may set impedance on the basis of a process, voltage, and temperature which are reflected into the reference resistance. Furthermore, the impedance setting circuit 120 may generate a control signal CTR_L corresponding to the impedance into which the reference resistance is reflected, and provide the generated control signal CTR_L to the data driving circuit 130. Although it will be described below, the impedance setting circuit 120 may set impedance by performing a hidden calibration operation on the basis of the first internal command signal CMD_1.

The data driving circuit 130 may be enabled on the basis of the second internal command signal CMD_2, and configured to perform the data driving operation on the basis of the set impedance. The data driving circuit 130 may perform the data driving operation, i.e., at least one of the data input operation and the data output operation. The data driving circuit 130 may control a loading value which is reflected during the data driving operation, on the basis of the control signal CTR_L provided by the impedance setting circuit 120. At this time, the control signal CTR_L may correspond to the impedance set by the impedance setting circuit 120. Therefore, the data driving circuit 130 may perform the data driving operation on the basis of the impedance into which the reference resistance is reflected.

Hereafter, the data driving circuit 130 will be described in more detail. The data driving circuit 130 may include a data input circuit 131 and a data output circuit 132.

The data input circuit 131 may be configured to receive the external data signal DAT_EXT and output the received signal as the internal data signal DAT_INN, on the basis of impedance set during the data input operation. The data input circuit 131 may be enabled on the basis of the second internal command signal CMD_2. The internal data signal DAT_INN outputted by the enabled data input circuit 131 may be stored in a memory bank circuit (not illustrated) included in the semiconductor apparatus 100, for example. Although not illustrated in the drawing, the data input circuit 131 may include a circuit having a loading value controlled on the basis of the control signal CTR_L. The data input circuit 131 may control a loading value and thus implement impedance matching for the external data signal DAT_EXT which is inputted during the data input operation.

The data output circuit 132 may be configured to receive the internal data signal DAT_INN and output the received signal as the external data signal DAT_EXT, on the basis of impedance set during the data output operation. The data output circuit 132 may be enabled on the basis of the second internal command signal CMD_2. The external data signal DAT_EXT outputted by the enabled data output circuit 132 may be provided to a control device (not illustrated) which controls the semiconductor apparatus 100, for example. Although not illustrated in the drawing, the data output circuit 132 may include a circuit having a loading value controlled on the basis of the control signal CTR_L. The data output circuit 132 may control drivability for the external data signal DAT_EXT which is outputted through the loading value control. The data output circuit 132 may control the drivability and thus implement impedance matching for the external data signal DAT_EXT which is outputted during the data output operation.

For reference, the circuit which is included in the data input circuit 131 and whose loading value is controlled, and the circuit which is included in the data output circuit 132 and whose loading value is controlled, may be one circuit configuration shared by each other.

The semiconductor apparatus 100 in accordance with an embodiment may set impedance into which the reference resistance is reflected, just before the data driving operation. More specifically, the semiconductor apparatus 100 may set the impedance into which the reference resistance is reflected, just before the data input operation as the data driving operation. Furthermore, the semiconductor apparatus 100 may set the impedance into which the reference resistance is reflected, just before the data output operation as the data driving operation. That is, the semiconductor apparatus 100 may set impedance corresponding to a process, voltage, and temperature which are reflected into the reference resistance, before the data driving operation. Therefore, the semiconductor apparatus 100 may perform the data driving operation in an optimized environment on the basis of the impedance corresponding to the reference resistance into which the process, voltage, and temperature just before the data driving operation are reflected.

Figure 2:
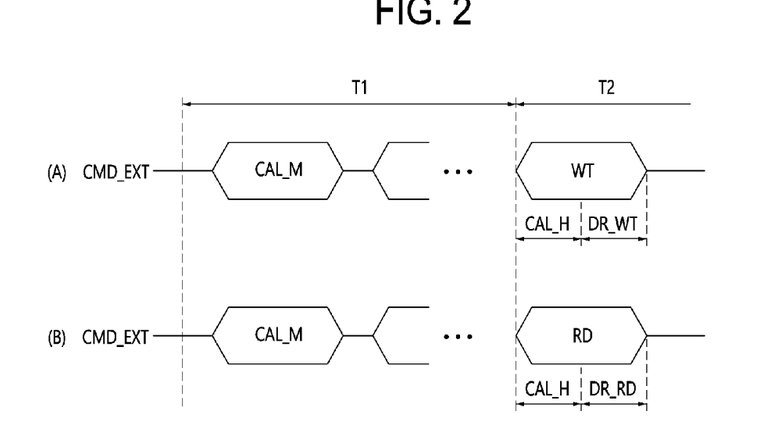
FIG. 2 is a timing diagram illustrating an operating method of the semiconductor apparatus of FIG. 1 in accordance with an embodiment of the present disclosure.

FIG. 2 is a timing diagram illustrating an operating method of the semiconductor apparatus 100 of FIG. 1 in accordance with an embodiment of the present disclosure.

Referring to FIGS. 1 and 2, the semiconductor apparatus 100 may include a setup operation time T1 and a normal operation time T2.

The setup operation time T1 may be a time period for performing a main calibration operation on the reference resistance. The semiconductor apparatus 100 may receive a main calibration command signal CAL_M corresponding to the main calibration operation through an external command signal CMD_EXT in the setup operation time T1. The semiconductor apparatus 100 may perform the main calibration operation on the basis of the main calibration command signal CAL_M. The main calibration operation and the hidden calibration operation which will be described below in more detail may be enabled on the basis of the external command signals CMD_EXT which are inputted at different time points, respectively. Furthermore, the main calibration operation and the hidden calibration operation may be performed at different operation times, respectively. For reference, in the setup operation time T1, various setup operations other than the main calibration operation may be performed. Furthermore, the main calibration operation may be omitted depending on a circuit operation.

The normal operation time T2 may be a time period for performing the data driving operation. In FIG. 2, (A) may indicate an operation corresponding to a write command signal WT which corresponds to a data input operation DR_WT. Furthermore, (B) may indicate an operation corresponding to a read command signal RD which corresponds to a data output operation DR_RD. As described above, the semiconductor apparatus 100 in accordance with an embodiment may set impedance through a hidden calibration operation CAL_H just before the data input operation DR_WT and the data output operation DR_RD.

First, the operation A corresponding to the write command signal WT in the normal operation time T2 will be described.

Referring to FIGS. 1 and 2, the semiconductor apparatus 100 may receive the write command signal WT corresponding to the data input operation DR_WT through the external command signal CMD_EXT in the normal operation time T2. The command generation circuit 110 may preferentially activate the first internal command signal CMD_1 on the basis of the write command signal WT. Therefore, the impedance setting circuit 120 may set impedance for the reference resistance through the hidden calibration operation CAL_H on the basis of the write command signal WT. Then, the command generation circuit 110 may sequentially activate the second internal command signal CMD_2 after the first internal command signal CMD_1. Therefore, the data input circuit 131 may perform the data input operation DR_WT on the basis of the write command signal WT. At this time, the impedance set through the hidden calibration operation CAL_H which has been performed just before the data input operation DR_WT may be reflected into the data input operation DR_WT.

As a result, the hidden calibration operation CAL_H may be performed in a time period in which the write command signal WT is inputted. FIG. 2 illustrates that the data input operation DR_WT is performed in the time period in which the write command signal WT is inputted. However, the present embodiment is not limited thereto, but the data input operation DR_WT may be performed after the time period in which the write command signal WT is inputted.

Next, the operation B corresponding to the read command signal RD in the normal operation time T2 will be described.

Referring to FIGS. 1 and 2, the semiconductor apparatus 100 may receive the read command signal RD corresponding to the data output operation DR_RD through the external command signal CMD_EXT in the normal operation time T2. The command generation circuit 110 may preferentially activate the first internal command signal CMD_1 on the basis of the read command signal RD. Therefore, the impedance setting circuit 120 may set impedance for the reference resistance through the hidden calibration operation CAL_H on the basis of the read command signal RD. Then, the command generation circuit 110 may sequentially activate the second internal command signal CMD_2 after the first internal command signal CMD_1. Therefore, the data output circuit 132 may perform the data output operation DR_RD on the basis of the read command signal RD. At this time, the impedance set through the hidden calibration operation CAL_H which has been performed just before the data output operation DR_RD may be reflected into the data output operation DR_RD.

As a result, the hidden calibration operation CAL_H may be performed in a time period in which the read command signal RD is inputted. FIG. 2 illustrates that the data output operation DR_RD is performed in the time period in which the read command signal RD is inputted. However, the present embodiment is not limited thereto, but the data output operation DR_RD may be performed after the time period in which the read command signal RD is inputted.

The semiconductor apparatus 100 in accordance with the present embodiment may set impedance by performing the hidden calibration operation CAL_H just before the data input operation DR_WT. Therefore, the impedance corresponding to the process, voltage, and temperature, which are reflected into the reference resistance during the hidden calibration operation CAL_H, may be applied to the data input operation DR_WT. Furthermore, the semiconductor apparatus 100 may set impedance by performing the hidden calibration operation CAL_H just before the data output operation DR_RD. Therefore, the impedance corresponding to the process, voltage, and temperature, which are reflected into the reference resistance during the hidden calibration operation CAL_H, may be applied to the data output operation DR_RD. As a result, the semiconductor apparatus 100 may perform the data driving operation in the optimized environment on the basis of the impedance into which the process, voltage, and temperature just before the data driving operation are reflected.

Referring back to FIGS. 1 and 2, the data driving circuit 130 may consume a current through the data driving operation. In other words, the data input circuit 131 of the data driving circuit 130 may consume a current by driving a data signal which is inputted to the semiconductor apparatus 100 during the data input operation DR_WT. The data output circuit 132 of the data driving circuit 130 may also consume a current by driving a data signal outputted from the semiconductor apparatus 100 during the data output operation DR_RD. The current consumed by the data driving circuit 130 may cause a voltage drop in the semiconductor apparatus 100. At this time, the voltage drop may differ depending on the logic value and transition state of the data signal driven by the data driving circuit 130.

The logic value may include a logic 'high' level value or logic 'low' level value, for example, which the data signal has. The transition state may include the state in which the data signal transitions from a logic 'low' level to a logic 'high' level or transitions from a logic 'high' level to a logic 'low' level, when the previous data signal and the current data signal are compared to each other. That is, different voltage drops may occur in the semiconductor apparatus 100, depending on the logic value and transition state of the data signal which is driven during the data driving operation.

Hereafter, for convenience of description, at least one piece of information between logic value information and transition state information may be defined as 'data pattern information'. The data driving circuit 130 may consume different currents depending on the data pattern information of the data signal which is driven during the data driving operation. Therefore, different voltage drops may occur in the semiconductor apparatus 100, depending on the data pattern information.

As described above, with the increase in integration density of the semiconductor apparatus 100, the circuit operation of the semiconductor apparatus 100 may be affected even by a minimal environment change. Hereafter, an embodiment which can perform a hidden calibration operation by compensating for a voltage drop which occurs during the data driving operation will be described.

Figure 3:
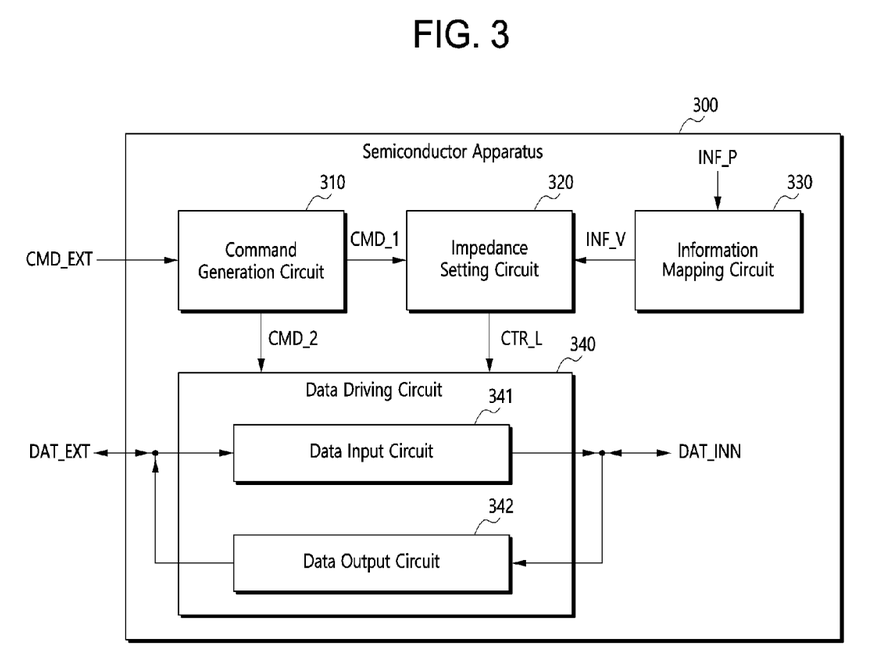
FIG. 3 is a block diagram illustrating the configuration of a semiconductor apparatus in accordance with an embodiment of the present disclosure.

FIG. 3 is a block diagram illustrating the configuration of a semiconductor apparatus 300 in accordance with an embodiment of the present disclosure.

Referring to FIG. 3, the semiconductor apparatus 300 may include a command generation circuit 310, an impedance setting circuit 320, an information mapping circuit 330, and a data driving circuit 340. The command generation circuit 310 and the data driving circuit 340 may correspond to the command generation circuit 110 and the data driving circuit 130 of FIG. 1, respectively. Therefore, the detailed descriptions of the command generation circuit 310 and the data driving circuit 340 will be omitted. For reference, a data input circuit 341 and a data output circuit 342 of the data driving circuit 340 may also correspond to the data input circuit 131 and the data output circuit 132 of the data driving circuit 130 of FIG. 1, respectively.

Hereafter, the impedance setting circuit 320 and the information mapping circuit 330 will be described.

The impedance setting circuit 320 may be enabled on the basis of the first internal command signal CMD_1. Furthermore, the impedance setting circuit 320 may be configured to set impedance by applying a voltage level corresponding to voltage drop information INF_V to the reference resistance. As described above, the data driving circuit 340 may consume a current during the data driving operation, and a voltage drop may thus occur in the semiconductor apparatus 300. Although the voltage drop information INF_V will be described below, the voltage drop information INF_V may have information on a voltage drop which occurs when the data driving circuit 340 is driven according to the data pattern information INF_P. Therefore, the impedance setting circuit 320 may perform a hidden calibration operation into which the voltage drop during the data driving operation is reflected, on the basis of the voltage drop information INF_V.

The information mapping circuit 330 may be configured to map the voltage drop information INF_V corresponding to the current consumed during the data driving operation according to the data pattern information INF_P, and provide the mapped information to the impedance setting circuit 320. The information mapping circuit 330 may store the voltage drop information INF_V corresponding to the data pattern information INF_P. The information mapping circuit 330 may map the voltage drop information INF_V corresponding to the voltage drop which occurs during the data driving operation according to the data pattern information INF_P, and output the mapped information. The output voltage drop information INF_V may be provided to the impedance setting circuit 320.

The data pattern information INF_P may correspond to at least one data signal of a data signal to be inputted to the semiconductor apparatus 300 through the external data signal DAT_EXT, a data signal to be outputted from the semiconductor apparatus 300 through the internal data signal DAT_INN, and a random data signal. Furthermore, the data pattern information INF_P may include one or more of the logic value information and the transition state information of a corresponding data signal among the data signal to be inputted, the data signal to be outputted, and the random data signal.

Therefore, the impedance setting circuit 320 may perform the hidden calibration operation on the basis of the data pattern information INF_P corresponding to a data signal to be inputted during the data input operation. The impedance setting circuit 320 may perform the hidden calibration operation on the basis of the data pattern information INF_P corresponding to a data signal to be outputted during the data output operation. Furthermore, the impedance setting circuit 320 may perform the hidden calibration operation just before the data driving operation, on the basis of the data pattern information INF_P corresponding to the random data signal.

More specifically, the semiconductor apparatus 300 may receive the external data signal DAT_EXT during the data input operation. At this time, the data input circuit 341 may be driven on the basis of the external data signal DAT_EXT, and a voltage drop may occur in the semiconductor apparatus 300. Furthermore, the semiconductor apparatus 300 in accordance with an embodiment may perform the hidden calibration operation just before the data input operation, on the basis of the data pattern information INF_P corresponding to the data signal to be inputted. Therefore, the semiconductor apparatus 300 may perform the hidden calibration operation into which the voltage drop which occurs during the data input operation of the data input circuit 341 is reflected in advance. As a result, the semiconductor apparatus 300 may set impedance, into which the voltage drop has been reflected, for the external data signal DAT_EXT as the data signal to be inputted. The semiconductor apparatus 300 may implement impedance matching for the external data signal DAT_EXT through the impedance set during the data input operation.

During the data output operation, the semiconductor apparatus 300 may output the internal data signal DAT_INN. At this time, the data output circuit 342 may be driven on the basis of the internal data signal DAT_INN, and a voltage drop may occur in the semiconductor apparatus 300. Furthermore, the semiconductor apparatus 300 in accordance with an embodiment may perform the hidden calibration operation just before the data output operation, on the basis of the data pattern information INF_P corresponding to the data signal to be outputted. Therefore, the hidden calibration operation may reflect the voltage drop, which occurs during the data output operation of the data output circuit 342, in advance. As a result, the semiconductor apparatus 300 may set impedance, into which the voltage drop has been reflected, for the internal data signal DAT_INN as the data signal to be outputted. The semiconductor apparatus 300 may implement impedance matching for the internal data signal DAT_INN through the set impedance during the data output operation.

Then, during the data driving operation, the semiconductor apparatus 300 may perform the hidden calibration operation on a random data signal. Although the random data signal may be different from the data signal to be inputted and the data signal to be outputted, a voltage drop corresponding to the current consumption of the data driving circuit 340 may be reflected to some degree. Therefore, the hidden calibration operation may reflect the voltage drop, which occurs during the data driving operation of the data driving circuit 340, in advance. As a result, the semiconductor apparatus 300 may set impedance, into which the voltage drop has been reflected, for the random data signal. Then, the semiconductor apparatus 300 may implement impedance matching for the data signal to be outputted during the data driving operation and impedance matching for the data signal to be inputted during the data driving operation, through the set impedance.

Figure 4:
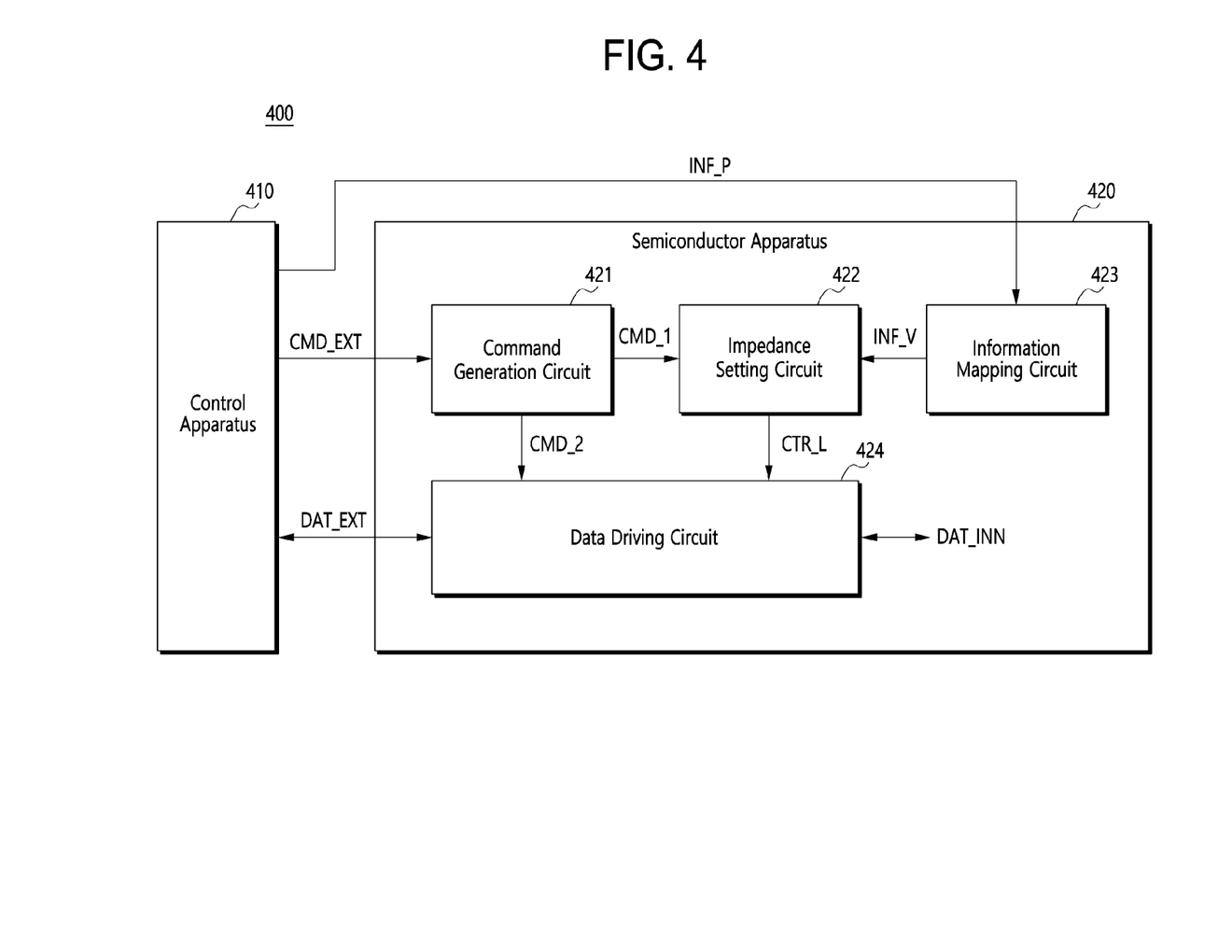
FIG. 4 is a block diagram illustrating the configuration of a semiconductor system in accordance with an embodiment of the present disclosure.

FIG. 4 is a block diagram illustrating the configuration of a semiconductor system 400 in accordance with an embodiment of the present disclosure. The semiconductor system 400 of FIG. 4 may include a circuit configuration corresponding to the data input operation.

Referring to FIG. 4, the semiconductor system 400 may include a control apparatus 410 and a semiconductor apparatus 420.

The control apparatus 410 may be configured to provide a data command signal for the data driving operation through the external command signal CMD_EXT. The control apparatus 410 may be configured to provide the data pattern information INF_P for the hidden calibration operation.

The semiconductor apparatus 420 may be configured to sequentially perform the hidden calibration operation and the data driving operation on the basis of the data pattern information INF_P and the data command signal provided through the external command signal CMD_EXT. The semiconductor apparatus 420 may include a command generation circuit 421, an impedance setting circuit 422, an information mapping circuit 423, and a data driving circuit 424. The command generation circuit 421, the impedance setting circuit 422, the information mapping circuit 423, and the data driving circuit 424 may correspond to the command generation circuit 310, the impedance setting circuit 320, the information mapping circuit 330, and the data driving circuit 340 of FIG. 3, respectively. Therefore, the detailed descriptions of the circuit operations of the respective components will be omitted herein.

However, the information mapping circuit 423 of FIG. 4 may receive the data pattern information INF_P through the control apparatus 410. The data pattern information INF_P may include one or more pieces of information between logical value information and transition state information of a data signal to be inputted to the semiconductor apparatus 420, i.e., the external data signal DAT_EXT. As described with reference to FIG. 3, the data pattern information INF_P may include one or more pieces of information between logical value information and transition state information of a random data signal.

Hereafter, the data input operation for the semiconductor system 400 will be described.

During the data input operation, the control apparatus 410 may provide the semiconductor apparatus 420 with the external command signal CMD_EXT corresponding to the data input operation and the data pattern information INF_P corresponding to the data signal to be inputted. The command generation circuit 421 of the semiconductor apparatus 420 may preferentially activate the first internal command signal CMD_1 on the basis of a data command signal inputted through the external command signal CMD_EXT. The information mapping circuit 423 of the semiconductor apparatus 420 may map the voltage drop information INF_V corresponding to the data pattern information INF_P, and output the mapped information.

The impedance setting circuit 422 may be enabled on the basis of the first internal command signal CMD_1. Furthermore, the impedance setting circuit 422 may apply a voltage level corresponding to the voltage drop information INF_V to the reference resistance in advance, and set impedance through the hidden calibration operation.

Then, the command generation circuit 421 may activate the second internal command signal CMD_2, and the data driving circuit 424 may be enabled on the basis of the second internal command signal CMD_2. The data driving circuit 424 may perform the data input operation on the external data signal DAT_EXT by reflecting the impedance set through the control signal CTR_L.

The semiconductor system 400 in accordance with an embodiment may perform the hidden calibration operation on the basis of the data pattern information INF_P. Furthermore, the semiconductor system 400 may perform the data input operation in the optimal environment on the basis of the impedance set through the hidden calibration operation.

Figure 5:
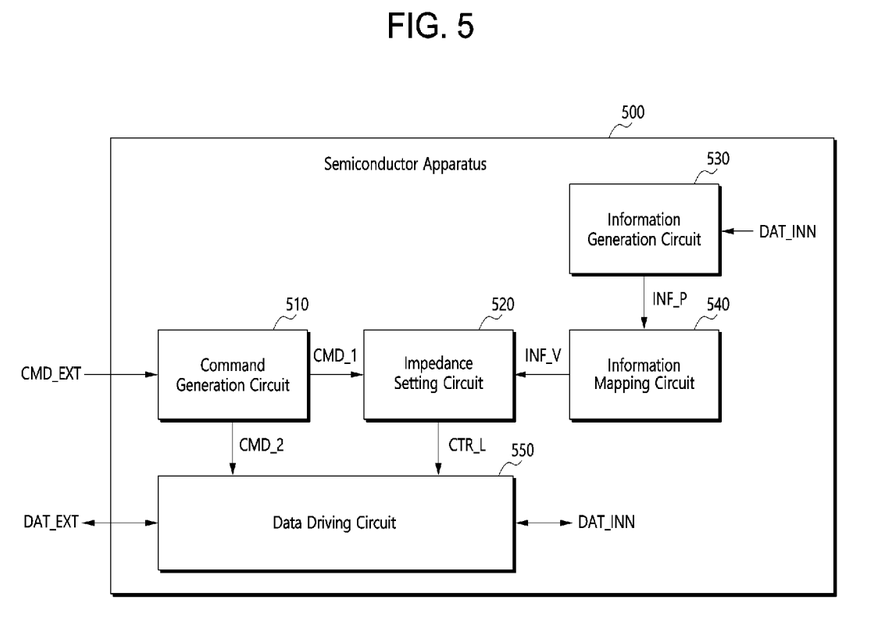
FIG. 5 is a block diagram illustrating the configuration of a semiconductor apparatus in accordance with an embodiment of the present disclosure.

FIG. 5 is a block diagram illustrating the configuration of a semiconductor apparatus 500 in accordance with an embodiment of the present disclosure. The semiconductor apparatus 500 of FIG. 5 may include a circuit configuration corresponding to the data output operation.

Referring to FIG. 5, the semiconductor apparatus 500 may include a command generation circuit 510, an impedance setting circuit 520, an information generation circuit 530, an information mapping circuit 540, and a data driving circuit 550. The semiconductor apparatus 500 of FIG. 5 additionally includes the information generation circuit 530, compared to the semiconductor apparatus 300 of FIG. 3. For convenience of description, the following descriptions will be focused on a circuit configuration related to the information generation circuit 530.

The information generation circuit 530 may be configured to generate the data pattern information INF_P corresponding to the internal data signal DAT_INN provided by a memory bank circuit (not illustrated), and provide the generated information to the information mapping circuit 540. The internal data signal DAT_INN may correspond to the data signal to be outputted, which has been described with reference to FIG. 3.

Hereafter, the data output operation of the semiconductor apparatus 500 will be described.

During the data output operation, the semiconductor apparatus 500 may receive the external command signal CMD_EXT corresponding to the data output operation. The command generation circuit 510 of the semiconductor apparatus 500 may preferentially activate the first internal command signal CMD_1 on the basis of a data command signal inputted through the external command signal CMD_EXT. The information generation circuit 530 may generate the data pattern information INF_P on the basis of the internal data signal DAT_INN corresponding to a data signal to be outputted. The information mapping circuit 540 may generate the voltage drop information INF_V on the basis of the data pattern information INF_P.

The impedance setting circuit 520 may be enabled on the basis of the first internal command signal CMD_1. Furthermore, the impedance setting circuit 520 may apply a voltage level corresponding to the voltage drop information INF_V to the reference resistance in advance, and set impedance through the hidden calibration operation.

Then, the command generation circuit 510 may activate the second internal command signal CMD_2, and the data driving circuit 550 may be enabled on the basis of the second internal command signal CMD_2. The data driving circuit 550 may perform the data output operation on the internal data signal DAT_INN by reflecting the impedance set through the control signal CTR_L.

The semiconductor apparatus 500 in accordance with an embodiment may perform the hidden calibration operation on the basis of the data pattern information INF_P. Furthermore, the semiconductor apparatus 500 may perform the data output operation in the optimal environment on the basis of the impedance set through the hidden calibration operation.

Figure 6:
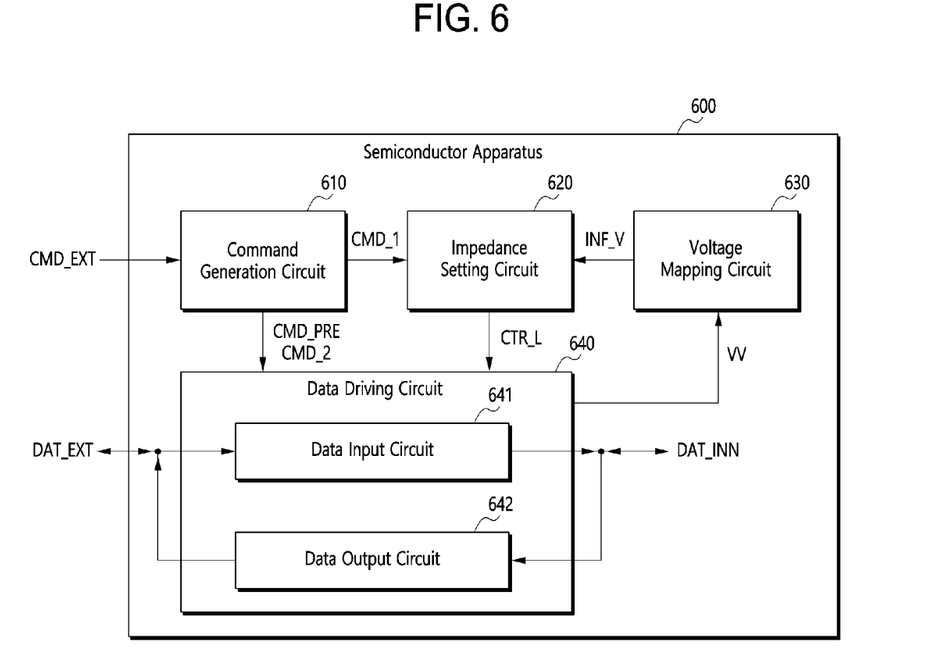
FIG. 6 is a block diagram illustrating the configuration of a semiconductor apparatus in accordance with an embodiment of the present disclosure.

FIG. 6 is a block diagram illustrating the configuration of a semiconductor apparatus 600 in accordance with an embodiment of the present disclosure.

Referring to FIG. 6, the semiconductor apparatus 600 may include a command generation circuit 610, an impedance setting circuit 620, a voltage mapping circuit 630, and a data driving circuit 640.

The command generation circuit 610 may be configured to generate a pre-internal command signal CMD_PRE and the first and second internal command signals CMD_1 and CMD_2 on the basis of the external command signal CMD_EXT corresponding to a data driving operation. The pre-internal command signal CMD_PRE may be an internal command signal for a 'pre-data driving operation' which will be described below. The pre-internal command signal CMD_PRE and the first internal command signal CMD_1 may have a dependent relationship with each other. That is, the pre-internal command signal CMD_PRE may be activated before the first internal command signal CMD_1 is activated. That is, the pre-internal command signal CMD_PRE, the first internal command signal CMD_1, and the second internal command signal CMD_2 will be sequentially activated.

The impedance setting circuit 620 may be enabled on the basis of the first internal command signal CMD_1. The impedance setting circuit 620 may be configured to set impedance by applying a voltage level corresponding to the voltage drop information INF_V to the reference resistance.

The voltage mapping circuit 630 may be configured to map the voltage drop information INF_V corresponding to voltage level value information VV of a power supply voltage, and provide the mapped information to the impedance setting circuit 620, during the pre-data driving operation. The voltage level value information VV may correspond to the voltage level value of a power supply voltage applied to the data driving circuit 640. The voltage mapping circuit 630 may map the voltage level value information VV corresponding to a voltage drop which occurs in the data driving circuit 640, and output the mapped information as the voltage drop information INF_V, during the pre-data driving operation. The output voltage drop information INF_V may be provided to the impedance setting circuit 620.

The data driving circuit 640 may be configured to perform the pre-data driving operation on the basis of the pre-internal command signal CMD_PRE. The pre-data driving operation may include one or more of a pre-data input operation and a pre-data output operation. The pre-data driving operation may be similar to the data driving operation, and may be performed before the hidden calibration operation. That is, the pre-data input operation may be performed before the hidden calibration operation which is performed before the data input operation. The pre-data input operation may be performed on the basis of a data signal which is to be inputted during the data input operation. The pre-data output operation may be performed before the hidden calibration operation which is performed before the data output operation. The pre-data output operation may be performed on the basis of a data signal which is to be outputted during the data output operation.

As described above, the data driving circuit 640 may be enabled on the basis of the second internal command signal CMD_2, and configured to perform the data driving operation on the basis of the set impedance. Since the data driving operation of the data driving circuit 640, corresponding to the second internal command signal CMD_2, has been already described above, the detailed descriptions thereof will be omitted herein.

The following descriptions will be focused on the pre-data driving operation of the data driving circuit 640. The data driving circuit 640 may include a data input circuit 641 and a data output circuit 642.

The data input circuit 641 may be configured to perform the pre-data input operation on the basis of the pre-internal command signal CMD_PRE. The data input circuit 641 may be driven by the external data signal DAT_EXT received during the pre-data input operation. At this time, a voltage drop may occur in a power supply voltage applied to the data input circuit 641. The data input circuit 641 may provide the voltage mapping circuit 630 with the voltage level value information VV corresponding to the voltage drop.

The data output circuit 642 may be configured to perform the pre-data output operation on the basis of the pre-internal command signal CMD_PRE. The data output circuit 642 may be driven by the internal data signal DAT_INN received during the pre-data output operation. At this time, a voltage drop may occur in a power supply voltage applied to the data output circuit 642. The data output circuit 642 may provide the voltage mapping circuit 630 with the voltage level value information VV corresponding to the voltage drop.

Hereafter, the data input operation of the semiconductor apparatus 600 will be described.

During the data input operation, the semiconductor apparatus 600 may receive a data command signal corresponding to the data input operation through the external command signal CMD_EXT. The command generation circuit 610 may preferentially activate the pre-internal command CMD_PRE on the basis of the data command signal. Therefore, the data input circuit 641 of the data driving circuit 640 may be enabled to perform the pre-data input operation. That is, the data input circuit 641 may be driven by receiving the external data signal DAT_EXT. At this time, a voltage drop may be caused by the operation of the data input circuit 641, and the data input circuit 641 may output the voltage drop as the voltage level value information VV. The voltage mapping circuit 630 may generate the voltage drop information INF_V on the basis of the voltage level value information VV.

The command generation circuit 610 may activate the first internal command signal CMD_1. Therefore, the impedance setting circuit 620 may be enabled on the basis of the first internal command signal CMD_1. Furthermore, the impedance setting circuit 620 may apply a voltage level corresponding to the voltage drop information INF_V to the reference resistance in advance, and set impedance through the hidden calibration operation. At this time, the impedance may be set in such a state that the process, voltage, and temperature are almost the same as those when the external data signal DAT_EXT is driven in the data input circuit 641 during the data input operation.

Then, the command generation circuit 610 may activate the second internal command signal CMD_2. Therefore, the data input circuit 641 may be enabled on the basis of the second internal command signal CMD_2. The data input circuit 641 may perform the data input operation on the external data signal DAT_EXT by reflecting the impedance set through the control signal CTR_L.

The semiconductor apparatus 600 in accordance with an embodiment may sequentially perform the pre-data input operation, the hidden calibration operation, and the data input operation. Therefore, the semiconductor apparatus 600 may set impedance in such a state that the process, voltage, and temperature are almost the same as those during the data input operation, through the pre-data input operation.

Hereafter, the data output operation of the semiconductor apparatus 600 will be described.

During the data output operation, the semiconductor apparatus 600 may receive a data command signal corresponding to the data output operation through the external command signal CMD_EXT. The command generation circuit 610 may preferentially activate the pre-internal command CMD_PRE on the basis of the data command signal. Therefore, the data output circuit 642 of the data driving circuit 640 may be enabled to perform the pre-data output operation. That is, the data output circuit 642 may be driven by receiving the internal data signal DAT_INN. At this time, a voltage drop may be caused by the operation of the data output circuit 642, and the data output circuit 642 may output the voltage drop as the voltage level value information VV. The voltage mapping circuit 630 may generate the voltage drop information INF_V on the basis of the voltage level value information VV.

The command generation circuit 610 may activate the first internal command signal CMD_1. Furthermore, the impedance setting circuit 620 may apply a voltage level corresponding to the voltage drop information INF_V to the reference resistance in advance, and set impedance through the hidden calibration operation. At this time, the impedance may be set in such a state that the process, voltage, and temperature are almost the same as those when the internal data signal DAT_INN is driven in the data output circuit 642 during the data output operation Then, the command generation circuit 610 may activate the second internal command signal CMD_2. The data output circuit 642 may perform the data output operation on the internal data signal DAT_INN by reflecting the impedance set through the control signal CTR_L.

The semiconductor apparatus 600 in accordance with an embodiment may sequentially perform the pre-data output operation, the hidden calibration operation, and the data output operation. Therefore, the semiconductor apparatus 600 may set impedance in such a state that the process, voltage, and temperature are almost the same as those during the data output operation, through the pre-data output operation.

While various embodiments have been described above, it will be understood to those skilled in the art that the embodiments described are examples only. Accordingly, the semiconductor apparatus, the semiconductor system, and the operating method, which are described herein, should not be limited based on the described embodiments and the following claims. Furthermore, the embodiments may be combined to form additional embodiments.

What is claimed is:

1. A semiconductor apparatus comprising:
a command generation circuit configured to generate a first internal command signal and a second internal command signal, which are generated on the basis of a data command signal for a data driving operation;
an impedance setting circuit enabled on the basis of the first internal command signal, and configured to set impedance into which a reference resistance is reflected;
an information mapping circuit configured to map voltage drop information corresponding to a current consumed during the data driving operation according to data pattern information, and provide the voltage drop information to the impedance setting circuit; and
a data driving circuit enabled on the basis of the second internal command signal, and configured to perform the data driving operation on the basis of the set impedance.

2. The semiconductor apparatus according to claim 1, wherein the second internal command signal has a dependent relationship with the first internal command signal.

3. The semiconductor apparatus according to claim 1, wherein the impedance setting circuit sets the impedance by performing a hidden calibration operation on the basis of the first internal command signal.

4. The semiconductor apparatus according to claim 1, wherein the data driving operation includes one or more of a data input operation and a data output operation.

5. The semiconductor apparatus according to claim 4, wherein the data driving circuit comprises a data input circuit configured to:
receive the second internal command signal, and
receive, during the data input operation, an external data signal to output the external data signal as an internal data signal on the basis of the set impedance.

6. The semiconductor apparatus according to claim 4, wherein the data driving circuit comprises a data output circuit configured to:
receive the second internal command signal, and
receive, during the data output operation, an internal data signal to output the internal data signal as an external data signal on the basis of the set impedance.

7. The semiconductor apparatus according to claim 1, wherein the information mapping circuit receives the data pattern information on one or more of a data signal to be inputted during a data input operation, a data signal to be outputted during a data output operation, and a random data signal.

8. The semiconductor apparatus according to claim 7, wherein the data pattern information comprises one or more pieces of logic value information and transition state information of a corresponding data signal among data signals to be inputted, the data signal to be outputted, and the random data signal.

9. The semiconductor apparatus according to claim 1, wherein the impedance setting circuit sets the impedance by applying, to the reference resistance, a voltage level corresponding to the voltage drop information.

10. The semiconductor apparatus according to claim 1, further comprising an information generation circuit configured to:
generate the data pattern information corresponding to an internal data signal provided by a memory bank circuit, and
provide the data pattern information to the information mapping circuit.

11. The semiconductor apparatus according to claim 1, wherein the command generation circuit is further configured to generate a pre-internal command signal for a pre-data driving operation before the first internal command signal is activated.

12. The semiconductor apparatus according to claim 11, wherein the pre-internal command signal and the first internal command signal have a dependent relationship with each other and are sequentially activated.

13. The semiconductor apparatus according to claim 11, wherein the data driving circuit is further configured to perform, on the basis of the pre-internal command signal, the pre-data driving operation on one or more of a data signal to be inputted during a data input operation and a data signal to be outputted during a data output operation.

14. The semiconductor apparatus according to claim 11, wherein the pre-data driving operation includes one or more of a pre-data input operation and a pre-data output operation.

15. The semiconductor apparatus according to claim 11, further comprising a voltage mapping circuit configured to map, during the pre-data driving operation, voltage drop information corresponding to voltage level value information of a power supply voltage to provide the voltage drop information to the impedance setting circuit.

16. A semiconductor system comprising:
a control apparatus configured to provide a data command signal for a data driving operation, and provide data pattern information for a hidden calibration operation; and
a semiconductor apparatus configured to sequentially perform the hidden calibration operation and the data driving operation on the basis of the data command signal and the data pattern information,
wherein the semiconductor apparatus comprises:
a command generation circuit configured to generate a first internal command signal and a second internal command signal, which are generated on the basis of the data command signal;
an impedance setting circuit enabled on the basis of the first internal command signal, and configured to set impedance through the hidden calibration operation by applying, to a reference resistance, a voltage level corresponding to voltage drop information;
an information mapping circuit configured to map the voltage drop information corresponding to a current consumed during the data driving operation according to the data pattern information to output the voltage drop information; and
a data driving circuit enabled on the basis of the second internal command signal, and configured to perform the data driving operation on the basis of the set impedance.

17. The semiconductor system according to claim 16, wherein the data pattern information comprises one or more pieces of logic value information and transition state information of a corresponding data signal of a data signal to be inputted to the semiconductor apparatus and a random data signal.

18. The semiconductor system according to claim 16, wherein the command generation circuit is further configured to generate a pre-internal command signal for a pre-data driving operation before the first internal command signal is activated.

19. The semiconductor system according to claim 18, wherein the pre-internal command signal and the first internal command signal have a dependent relationship with each other and are sequentially activated.

20. The semiconductor system according to claim 18, wherein the data driving circuit is further configured to perform, on the basis of the pre-internal command signal, the pre-data driving operation on a data signal to be inputted to the semiconductor apparatus.

21. An operation method of a semiconductor apparatus, comprising:
generating a pre-internal command signal for a pre-data driving operation on the basis of a data command signal for a data driving operation in a normal operation time after a setup operation time;
after generating the pre-internal command signal, generating a first internal command signal and a second internal command signal, which are generated on the basis of the data command signal;
setting impedance through a hidden calibration operation for a reference resistance, which is performed on the basis of the first internal command signal; and
performing, according to the second internal command signal, a data driving operation on the basis of the set impedance.

22. The operation method according to claim 21, further comprising performing a main calibration operation on the reference resistance in the setup operation time.

23. The operation method according to claim 22, wherein the main calibration operation and the hidden calibration operation are activated on the basis of external command signals inputted at respective time points, which are different from each other, and performed in respective operation times, which are different from each other.

24. The operation method according to claim 21, wherein the data driving operation includes one or more of a data input operation and a data output operation.

25. The operation method according to claim 21, wherein the setting the impedance comprises:
mapping voltage drop information corresponding to a current consumed during the data driving operation according to data pattern information; and
performing the hidden calibration operation by applying, to the reference resistance, a voltage level corresponding to the voltage drop information.

26. The operation method according to claim 25, wherein the data pattern information comprises one or more pieces of logic value information and transition state information of a corresponding data signal of a data signal to be inputted during a data input operation, a data signal to be outputted during a data output operation, and a random data signal.

27. The operation method according to claim 21, further comprising performing the pre-data driving operation including one or more of a pre-data input operation and a pre-data output operation on the basis of the pre-internal command signal.

28. The operation method according to claim 21, wherein the setting the impedance comprises:
mapping voltage drop information according to voltage level value information corresponding to a current consumed during the pre-data driving operation; and
performing the hidden calibration operation by applying, to the reference resistance, a voltage level corresponding to the voltage drop information.

29. An operating method of a semiconductor apparatus, the method comprising:
determining voltage drop information according to data pattern information corresponding to a data driving operation;
setting, during a normal operation after a setup operation including a first calibration operation, impedance by performing a second calibration operation which applies, to a reference resistance, a voltage level corresponding to the voltage drop information and reflects the reference resistance into the impedance; and
performing the data driving operation based on the impedance set through the second calibration operation.

* * * * *